US006093444A

United States Patent [19]
Miyauchi et al.

[11] Patent Number: 6,093,444
[45] Date of Patent: Jul. 25, 2000

[54] MAGNETORESISTIVE TRANSDUCER WITH SPIN-VALVE STRUCTURE AND MANUFACTURING METHOD OF THE SAME

[75] Inventors: Daisuke Miyauchi, Tokyo; Tetsuro Sasaki; Eiichi Omata, both of Nagano, all of Japan

[73] Assignee: TDK Corporation, Tokyo, Japan

[21] Appl. No.: 08/998,695

[22] Filed: Dec. 29, 1997

Related U.S. Application Data

[62] Division of application No. 08/662,179, Jun. 12, 1996, abandoned.

[30] Foreign Application Priority Data

Jun. 15, 1995 [JP] Japan ................................. 7-171585

[51] Int. Cl.$^7$ ................................................... G11B 5/66
[52] U.S. Cl. ........................ 427/128; 427/129; 427/130; 427/131; 204/192.2
[58] Field of Search ................................. 427/128–131; 204/192.2

[56] References Cited

U.S. PATENT DOCUMENTS

| | | | |
|---|---|---|---|
| 5,287,238 | 2/1994 | Baumgart | 360/113 |
| 5,422,571 | 6/1995 | Gurney | 360/113 |
| 5,528,440 | 6/1996 | Fontana | 360/113 |
| 5,549,978 | 8/1996 | Iwasaki | 360/113 |
| 5,556,718 | 9/1996 | Motomura | 360/113 |
| 5,583,725 | 12/1996 | Coffey | 360/113 |
| 5,585,199 | 12/1996 | Kamiguchi | 428/621 |
| 5,608,593 | 3/1997 | Kim | 360/113 |

FOREIGN PATENT DOCUMENTS

| | | |
|---|---|---|
| 0 538 871 | 4/1993 | European Pat. Off. . |
| 0 581 418 | 2/1994 | European Pat. Off. . |
| 0581418 | 2/1994 | European Pat. Off. . |
| 0 598 581 A2 | 5/1994 | European Pat. Off. . |
| 0 613 148 A2 | 8/1994 | European Pat. Off. . |
| 0 677 750 | 10/1995 | European Pat. Off. . |
| 0 687 917 A2 | 12/1995 | European Pat. Off. . |
| 4-358310 | 12/1992 | Japan . |
| 5-347013 | 12/1993 | Japan . |
| 6-223336 | 8/1994 | Japan . |
| 07074022 | 3/1995 | Japan . |

OTHER PUBLICATIONS

"Magnetoresistance of Multilayers with Two Magnetic Components", Yamamoto et al, *Journal of Magnetism and Magnetic Materials*, 99, (1991), pp. 243–252.

"Oscillations in Giant Magnetoresistance and Antiferromagnetic Coupling in [Ni$_{81}$Fe$_{19}$/Cu]$_N$, Multilayers", Parkin, *Appl. Phys. Lett.*, vol. 60, No. 4, Jan. 27, 1992, pp. 512–514.

"Giant Magnetoresistive in Soft Ferromagnetic Multilayers", Dieny et al, *Physical Review B*, vol. 43, No. 1, Jan. 1, 1991, pp. 1297–1300.

"Magnetotransport Properties of Magnetically Soft Spin–Valve Structures (Invited)", Dieny et al, *J. Appl. Phys.*, vol. 69, No. 8, Apr. 15, 1991, pp. 4774–4479.

"Magnetoresistance and Preferred Orientation in Fe–Mn/Ni–Fe/Cu/Ni–Fe Sandwiches with Various Buffer Layer Materials", Nakatani et al, *Jpn. J. Appl. Phys.*, vol. 33, Part 1, No. 1A, Jan. 1994, pp. 133–137.

"Improved Exchange Coupling Between Ferromagnetic Ni–Fe and Antiferromagnetic Ni–Mn–Based Films", Lin et al, *Appl. Phys. Lett.*, vol. 65, No. 9, Aug. 29, 1994, pp. 1183–1185.

"Giant Magnetoresistance Effect of Spin–Valve Multilayers using Various Antiferromagnetic Material Layers", Koike et al, *Abstract of Lecture at Spring Congress of Japanese Metallic Society*, No. 976, p. 362., 1992.

T. Lin et al. "Improved exchange coupling between ferromagnetic Ni–Fe and antiferromagnetic Ni–Mn–based films" Applied Physics Letter, vol. 65, No. 9, Aug. 29, 1994.

*Primary Examiner*—Leszek Kiliman
*Attorney, Agent, or Firm*—Arent Fox Kintner Plotkin & Kahn, PLLC

[57] ABSTRACT

A MR transducer with a spin-valve structure formed on a substrate. The spin-valve structure has at least an antiferromagnetic material layer made of a NiMn alloy, a first ferromagnetic material layer, a nonmagnetic material layer and a second ferromagnetic material layer sequentially deposited on the substrate in this order.

8 Claims, 9 Drawing Sheets

Hex: EXCHANGE BIAS FIELD (Oe)

MAGNETORESISTIVE TRANSDUCER WITH SPIN-VALVE STRUCTURE AND MANUFACTURING METHOD OF THE SAME

This is a Divisional of U.S. application Ser. No. 08/662,179, filed Jun. 12, 1996 now abandoned.

FIELD OF THE INVENTION

The present invention relates to a magnetoresistive (MR) read head used in a magnetic disk device, particularly relates to a MR transducer with magnetic material multilayers known as a spin-valve structure and to a method of manufacturing the same.

DESCRIPTION OF THE RELATED ART

A MR read head utilizing the MR effect has been known as it can provide higher output irrespective of relative speed with respect to a recording medium.

In a conventional MR transducer, a magnetic thin film made of an alloy of NiFe or NiCo is generally adopted. Recently, with demand for a higher output head, advanced magnetoresistance (MR) properties of magnetic multilayers of a magnetic material layer and a nonmagnetic material layer have attracted great attention.

Although a general NiFe alloy thin film will have for example a MR ratio of about 2%, H. Yamamoto et al., "Magnetoresistance of multilayers with two magnetic components", Journal of Magnetism and Magnetic Material, 99 (1991), pp.243–252 discloses that a magnetic multilayers formed by alternately layering NiFe alloy thin films and Co thin films and by interleaving Cu thin films between the respective magnetic layers exhibits a larger MR effect of about 10% at room temperature. Also, S. S. P. Parkin, "Oscillations in giant magnetoresistance and antiferromagnetic coupling in $[Ni_{81}Fe_{19}/Cu]_N$ multilayers", Applied Physics Letters, Vol.60, No.4, Jan. 27, 1992, pp.512–514 discloses that a magnetic multilayers formed by alternately layering NiFe thin films and Cu thin films exhibits a MR ratio exceeding 16% for external magnetic field of about 600 Oe.

Among various magnetic material multilayers, spin-valve structures have attracted the greatest attention due to its very high magnetic sensitivity. The spin-valve structures are for example disclosed in B. Dieny et al., "Giant magnetoresistance in soft ferromagnetic multilayers", PHYSICAL REVIEW B, Vol.43, No.1, Jan. 1, 1991, pp.1297–1300, B. Dieny et al., "Magnetotransport properties of magnetically soft spin-valve structures (invited)", Japanese Applied Physics, Vol.69, No.8, Apr. 15, 1991, pp.4774–4779, and Japanese Patent Unexamined Publication No.4(1992)-358310.

A fundamental spin-valve structure is a multilayered structure consisting of a ferromagnetic material layer, a nonmagnetic material layer, a ferromagnetic material layer and an antiferromagnetic material layer. The magnetization of the ferromagnetic material layer adjacent to the antiferromagnetic material layer is pinned due to an exchange bias magnetic field applied from the antiferromagnetic material layer, whereas the magnetization of the other ferromagnetic material layer can freely rotate depending upon the external magnetic field applied thereto. Thus, magnetization switching is introduced by different magnetic field between the two ferromagnetic material layers. The magnetization orientations of the two magnetic material layers therefore change between in parallel and in antiparallel with each other so that the electrical resistivity of this spin-valve structure greatly varies to obtain a giant MR effect. In the aforementioned document of B. Dieny et al., "Magnetotransport properties of magnetically soft spin-valve structures (invited)", Japanese Applied Physics, Vol.69, No.8, Apr. 15, 1991, pp.4774–4779, it is described that a giant MR effect such as a MR ratio of 4.1% in an external magnetic field of 10 Oe can be obtained by a spin-valve structure.

General spin-valve structures will have multilayers of NiFe/Cu/NiFe(or Co)/FeMn. The NiFe layer will be a permalloy of Ni:Fe=81:19 (at %). Although various kinds and also compositions of-the ferromagnetic material layer have been investigated, it has been recognized that the above-mentioned composition is optimum for obtaining good soft magnetic properties and giant MR effects. As for the ferromagnetic layer material pinned by the antiferromagnetic material layer, Co or an alloy containing Co may be used other than NiFe so as to provide a high MR ratio. Composition of the FeMn used for the antiferromagnetic layer material is in general Fe:Mn=50:50 (at %). FeMn exhibiting antiferromagnetic properties will be γ-FeMn. An under layer (buffer layer) material for obtaining strong texture with respect to this antiferromagnetic material layer has been investigated. For example, R. Nakatani et al., "Magnetoresistance and Preferred Orientation in Fe—Mn/Ni—Fe/Cu/Ni—Fe Sandwiches with Various Buffer Layer Materials", Japanese Applied Physics, Vol.33, Part 1, No.1A, January 1994, pp.133–137 reports that forming of fcc metals or alloy film on metal layer materials of Ta, Hf or Ti, for example will result strong texture.

Since the FeMn alloy film exhibits poor corrosion resistance and lower blocking temperature, as well as large thermal dependency of an exchange bias field, another antiferromagnetic layer materials instead of FeMn are searched. T. Lin et al., "Improved exchange coupling between ferromagnetic Ni—Fe and antiferromagnetic Ni—Mn-based films", Applied Physics Letters, Vol.65, No.9, Aug. 29, 1994, pp.1183–1185 discloses that NiMn exhibits high blocking temperature, stable exchange bias field and improved corrosion resistance. However, in order to exhibit antiferromagnetic properties, NiMn is required to take long time annealing process in a magnetic field at high temperature.

F. Koike et al., "Giant Magnetoresistance Effect of Spin-valve Multilayers Using Various Antiferromagnetic Material Layers", Abstract of Lecture at Spring Congress of Japanese Metallic Society, No.976, 1995, p.362 reports a spin-valve multilayers using NiMn as its antiferromagnetic layer material. However, this document discloses only a structure of NiFe/Cu/NiFe/NiMn only and there is no disclosure with respect to MR characteristics.

Japanese Patent Unexamined Publication No.5(1993)-347013 discloses usage of oxide such as NiO as for another antiferromagnetic layer materials.

As mentioned above, the antiferromagnetic layer material of NiMn exhibits high blocking temperature and low thermal dependency of exchange bias field, as well as excellent corrosion resistance. However, in order to obtain good antiferromagnetic properties, it is necessary for NiMn to perform a long time annealing process in a magnetic field at high temperature so as to form θ phase. Since the conventional spin-valve structure is fundamentally constituted by multilayers of a first ferromagnetic material layer, a nonmagnetic material layer, a second ferromagnetic material layer and an antiferromagnetic material layer, the annealing process has to be performed after the deposition of the antiferromagnetic material layer, namely after the deposition of all the layers of the spin-valve structure. Accordingly, mutual diffusions will occur at the interface between the nonmagnetic and second ferromagnetic material layers due to solution of Ni and Cu causing its MR ratio to reduce.

SUMMARY OF THE INVENTION

It is therefore an object of-the present invention to provide a MR transducer with a spin-valve structure and a method of manufacturing the MR transducer, whereby a giant MR effect can be stably obtained.

Another object of the present invention is to provide a MR transducer with a spin-valve structure and a method of manufacturing the MR transducer, whereby a high MR ratio can be obtained.

Further object of the present invention is to provide a MR transducer with a spin-valve structure and a method of manufacturing the MR transducer, whereby a large exchange bias field can be applied from an antiferromagnetic material layer.

Still further object of the present invention is to provide a MR transducer with a spin-valve structure and a method of manufacturing the MR transducer, whereby a high blocking temperature and a low thermal dependency of exchange bias field, as well as an excellent corrosion resistance.

According to the present invention, a MR transducer with a spin-valve structure formed on a substrate is provided. The spin-valve structure has at least an antiferromagnetic material layer made of a NiMn alloy, a first ferromagnetic material layer, a nonmagnetic material layer and a second ferromagnetic material layer sequentially deposited on the substrate in this order.

Also, according to the present invention, a MR transducer with a double spin-valve structure formed on a substrate is provided. The double spin-valve structure has at least a first antiferromagnetic material layer made of a NiMn alloy, a first ferromagnetic material layer, a first nonmagnetic material layer, a second ferromagnetic material layer, a second nonmagnetic material layer, a third ferromagnetic material layer and a second antiferromagnetic material layer sequentially deposited on the substrate in this order.

Since the antiferromagnetic material layer (first antiferromagnetic material layer) made of the NiMn alloy is disposed on the substrate side with respect to the nonmagnetic material layer (first nonmagnetic material layer) and the second ferromagnetic material layer, this NiMn alloy layer can be deposited and annealed in a magnetic field before depositions of the nonmagnetic material layer (first nonmagnetic material layer) and the second ferromagnetic material layer. Thus, even if a long time annealing process in a magnetic field at high temperature is performed in order to obtain good antiferromagnetic properties from the NiMn layer, no mutual diffusion will occur at the interface between the nonmagnetic material layer (first nonmagnetic material layer) and the second ferromagnetic material layer, which will cause the MR ratio to reduce. As a result, a MR transducer stably exhibiting a giant MR effect can be provided according to the present invention.

Also, since the NiMn alloy is used for the antiferromagnetic material layer (first antiferromagnetic material layer) instead of FeMn alloy, an exchange bias field from this antiferromagnetic material layer can be made large. Furthermore, a MR transducer with the antiferromagnetic material layer exhibiting a high blocking temperature and a low thermal dependency of exchange bias field, and with an excellent corrosion resistance can be provided.

In the double spin-valve structure, since the NiMn alloy which can provide good antiferromagnetic properties is used for the first antiferromagnetic layer material, possible disturbances of the pinned magnetization orientation due to the magnetic field produced by the sense current can be effectively prevented. Of course, the double spin-valve structure can stably provide a larger MR ratio than that by means of the fundamental spin-valve structure.

It is preferred that the transducer has a magnetoresistance ratio of 3.0% or more and an exchange bias field of 100 Oe or more.

Preferably, a layer thickness of the antiferromagnetic material layer (the first antiferromagnetic material layer) is 50–500 Angstrom.

It is also preferred that each of the first and second ferromagnetic material layers (the first, second and third ferromagnetic material layers) is made of an alloy containing at least one of Ni, Fe and Co, and that a layer thickness of the first ferromagnetic material layer is 15–150 Angstrom.

It is further preferred that the nonmagnetic material layer (each of the first and second nonmagnetic material layers) is made of at least one of Cu, Ag and Au, and that a layer thickness of the nonmagnetic material layer (the first nonmagnetic material layer) is 15–50 Angstrom.

By using these materials and layer thicknesses, a MR transducer with a high MR ratio can be provided.

Preferably, the spin-valve structure (double spin-valve structure) has an under layer deposited on the substrate as a lowest layer of the spin-valve structure, and the under layer is made of a metal of at least one of Ta, Hf, Cr, Nb, Zr and Ti.

Particularly, using a proper under layer will cause the double spin-valve structure to stably provide a larger MR ratio than that by means of the fundamental spin-valve structure. Also, this causes the double spin-valve structure to reduce a resistance between its electrodes. Furthermore, the double spin-valve structure with a proper under layer can prevent possible disturbances of the pinned magnetization orientation due to the magnetic field produced by the sense current.

According to the present invention, furthermore, a method of manufacturing a MR transducer with a spin-valve structure is provided. The method includes a deposition process for depositing thin-film layers on a substrate and an annealing process of annealing the deposited layers in a magnetic field. The deposition process has steps of sequentially depositing at least an antiferromagnetic material layer made of a NiMn alloy, a first ferromagnetic material layer, a nonmagnetic material layer and a second ferromagnetic material layer on the substrate in this order. The annealing process is performed before the depositing steps of the nonmagnetic material layer and the second ferromagnetic material layer.

Also, according to the present invention, a method of manufacturing a MR transducer with a double spin-valve structure is provided. The method includes a deposition process for depositing thin-film layers on a substrate and an annealing process of annealing the deposited layers in a magnetic field. The deposition process has steps of sequentially depositing at least a first antiferromagnetic material layer made of a NiMn alloy, a first ferromagnetic material layer, a first nonmagnetic material layer, a second ferromagnetic material layer, a second nonmagnetic material layer, a third ferromagnetic material layer and a second antiferromagnetic material layer. The annealing process is performed before the depositing steps of the first nonmagnetic material layer and the second ferromagnetic material layer.

It is preferred that the annealing process is a process for forming θ phase of the NiMn, and is performed before or after the depositing step of the first ferromagnetic material layer.

Since the antiferromagnetic material layer (the first antiferromagnetic material layer) made of the NiMn alloy is deposited and annealed in a magnetic field before depositions of the nonmagnetic material layer (the first nonmagnetic material layer) and the second ferromagnetic material layer, even if a long time annealing process in a magnetic field at high temperature is performed in order to obtain good antiferromagnetic properties from the NiMn layer, no mutual diffusion will occur at the interface between the nonmagnetic material layer (first nonmagnetic material layer) and the second ferromagnetic material layer, which will cause the MR ratio to reduce. As a result, a MR transducer stably exhibiting a high MR effect can be manufactured according to the present invention.

Further objects and advantages of the present invention will be apparent from the following description of the preferred embodiments of the invention as illustrated in the accompanying drawings.

DESCRIPTION OF THE PREFERRED EMBODIMENTS

Figure 1:
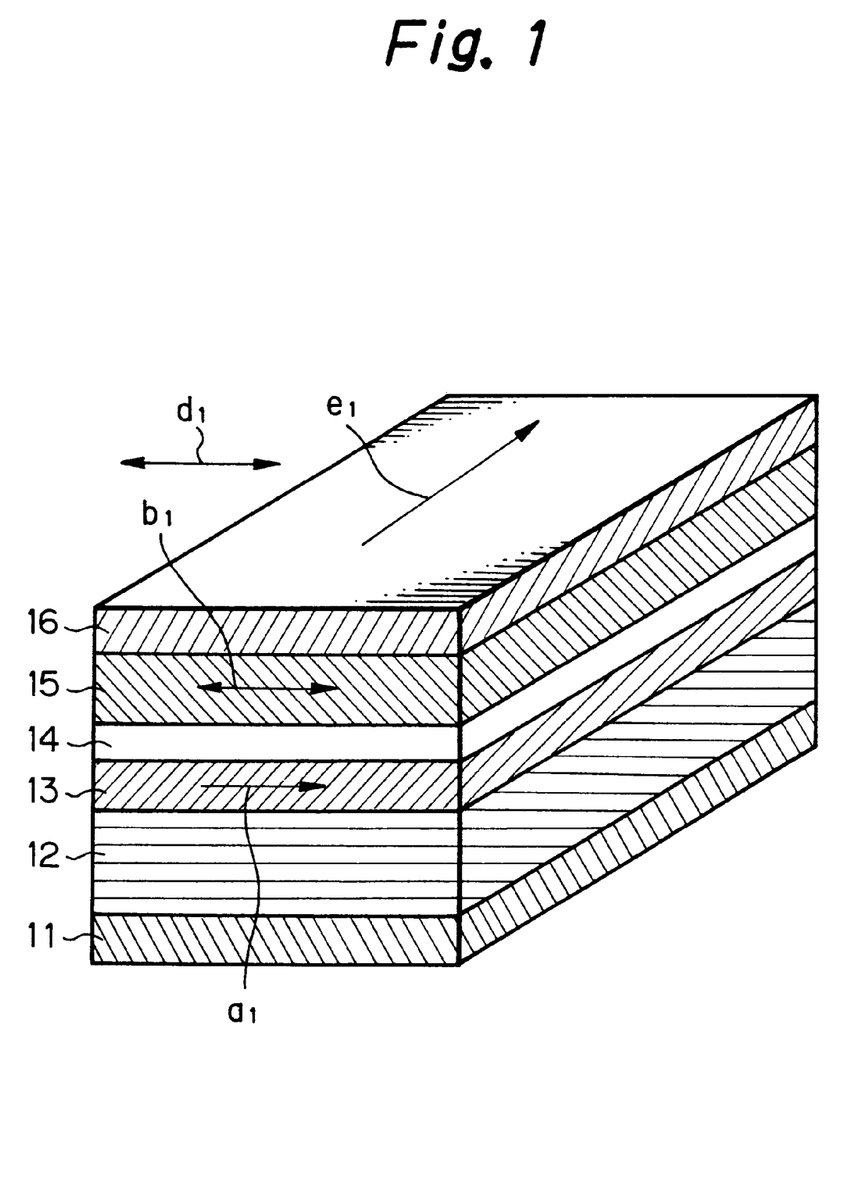
FIG. 1 is an oblique sectional view schematically showing a part of a preferred embodiment of a MR transducer according to the present invention.

In FIG. 1 which schematically shows a part of a preferred embodiment of a MR transducer according to the present invention, reference numeral 11 denotes an under layer deposited on a substrate (not shown). On the under layer 11, an antiferromagnetic material layer 12, a first ferromagnetic material layer 13, a nonmagnetic material layer 14, a second ferromagnetic material layer 15 and an antioxidant protection layer 16 are sequentially deposited in this order to form a layered spin-valve structure.

As is known, in a layered spin-valve structure, transport electrons are scattered and thus its MR value increases, if a magnetization orientation in its first ferromagnetic material layer differs from that in its second ferromagnetic material layer. The maximum magnetoresistance is attained when the magnetization orientations of the first and second ferromagnetic material layers are just the opposite with each other. In the concrete spin-valve structure according to the embodiment shown in FIG. 1, the magnetization orientation $a_1$ of the first ferromagnetic material layer 13 is pinned by means of the antiferromagnetic material layer 12, whereas the magnetization orientation $b_1$ of the second ferromagnetic material layer 15 is freely rotated depending upon magnetic field externally applied thereto, and accordingly, a high sensitive MR effect can be obtained.

In FIG. 1, furthermore, a direction of externally applied magnetic field $d_1$ and a flowing direction of a sense current $e_1$ are illustrated. Pinned magnetization orientation $a_1$ is in parallel with the direction of externally applied magnetic field $d_1$, but the sense current flows toward a direction $e_1$ perpendicular to these direction $a_1$ or $d_1$. An easy axis of the second ferromagnetic material layer 15 orients perpendicular to the direction of externally applied magnetic field $d_1$. Thus, magnetization switching will occur along a hard axis with reduction of coercive force resulting a good linearity of MR response curve to achieve. This also results reduced noise in case that this spin-valve structure is used as a MR transducer of the magnetic head. In general, the MR response curve is represented by a MR ratio along the axis of ordinates versus externally applied magnetic field along the axis of abscissas. The MR ratio is defined as $\Delta\rho/\rho s$, where $\rho s$ is the minimum resistivity and $\Delta\rho$ is a changed amount of the resistivity.

Various materials can be used for each layer of the spin-valve structure according to this embodiment. For example, it is preferred that the antiferromagnetic material layer 12 is made of NiMn, the first and second ferromagnetic material layers 13 and 15 are made of an alloy containing at least one of Ni, Fe and Co, the nonmagnetic material layer 14 is made of any one of Cu, Ag and Au. It is preferred that composition of the NiMn is Ni:Mn=50:50 (at %), particularly Ni:Mn=44:56 (at %). The first ferromagnetic material layer 13 is preferably made of Co or an alloy containing Co so as to achieve a higher MR ratio. The second ferromagnetic material layer 15 is preferably made of a material exhibiting good soft magnetic properties, particularly made of a permalloy with composition of Ni:Fe=81:19 (at %).

The antiferromagnetic material layer 12 is made of NiMn because it exhibits a high blocking temperature and a large S, inexchange bias field, as well as an excellent corrosion resistance. In order to obtain good antiferromagnetic properties from the NiMn layer, however, it is necessary to form θ phase in the NiMn layer by performing a long time annealing process in a magnetic field at high temperature. If the annealing process is performed after the deposition of all the layers of the spin-valve structure, mutual diffusions will occur at the interface between the nonmagnetic material layer 14 and the second ferromagnetic material layer 15 due to solution of Ni and Cu, causing the MR ratio thereof to reduce, as mentioned before.

Therefore, according to this embodiment, after the NiMn layer 12 and the first ferromagnetic material layer 13 are deposited, the long time annealing process in a magnetic field at high temperature is performed to form the θ phase having an antiferromagnetic property in the NiMn layer 12. Then, the surface of the first ferromagnetic layer 13 is etched to purify the surface, and thereafter the remaining layers of the spin-valve structure are sequentially deposited thereon. The thickness of the deposited first ferromagnetic material layer 13 before the annealing process and a removing thickness of the layer 13 will be optionally determined in accordance with a finally desired thickness of this first ferromagnetic material layer 13.

Figure 2:
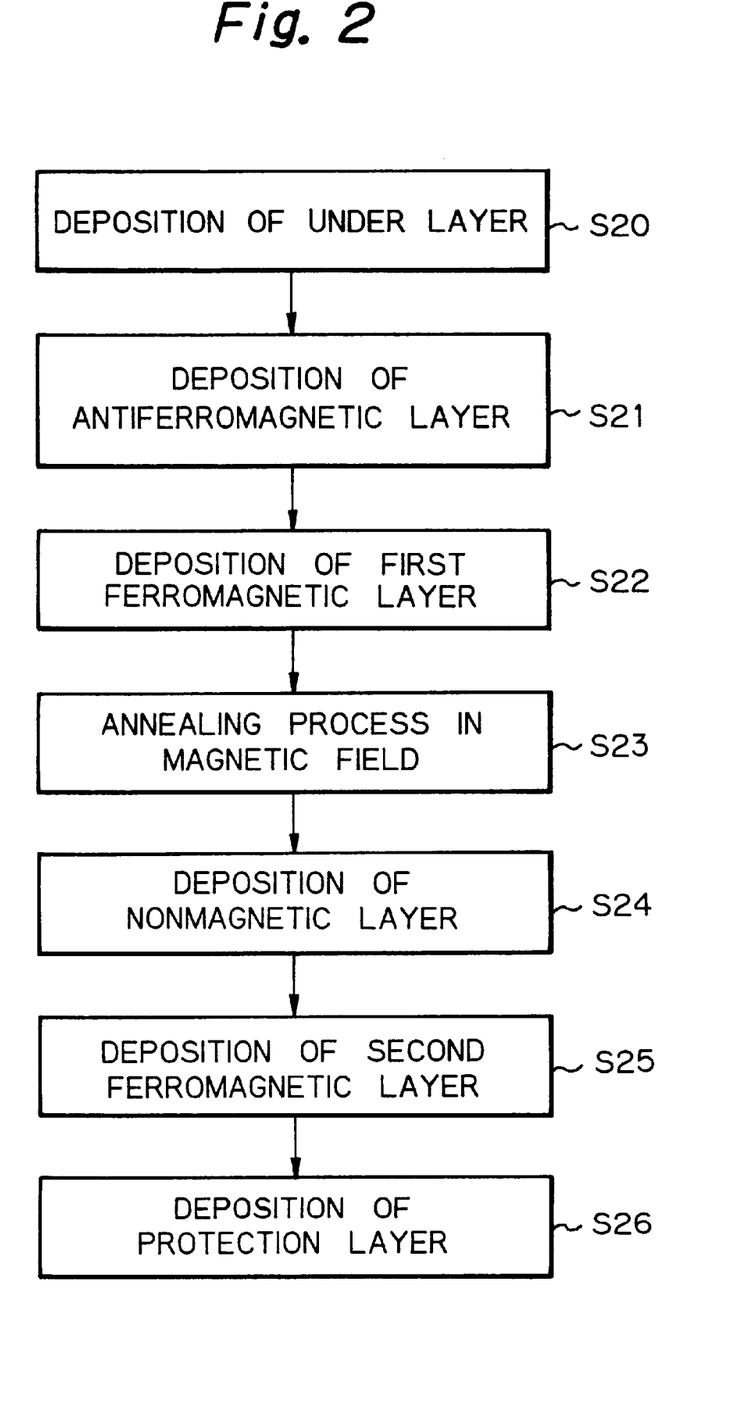
FIG. 2 is a flow chart illustrating an example of manufacturing processes of the embodiment shown in FIG. 1.

Referring to FIG. 2, manufacturing processes of the layered spin-valve structure shown in FIG. 1 will now be described. First, at step S20, the under layer 11 is deposited on the substrate (not shown). Multilayers of Ta and NiFe will be utilized as the under layer 11. The Ta layer is used for smoothing the interface, whereas the NiFe layer with the fcc structure is used so that the NiMn layer to be formed thereon can easily constitutes a fct structure. The under layer 11 can be made of one of Hf, Cr, Nb, Zr and Ti other than the above-mentioned-composition. Then, at steps S21 and S22, the antiferromagnetic material layer 12 of NiMn and the first ferromagnetic material layer 13 are deposited in sequence. At the next step S23, a long time annealing process in a magnetic field at high temperature with respect to the multilayers is performed to form θ phase of NiMn alloy. Then, at steps S24 to S26, the nonmagnetic material layer 14, the second ferromagnetic material layer 15 and the antioxidant protection layer 16 are sequentially deposited in this order to form a layered spin-valve structure.

Figure 3:
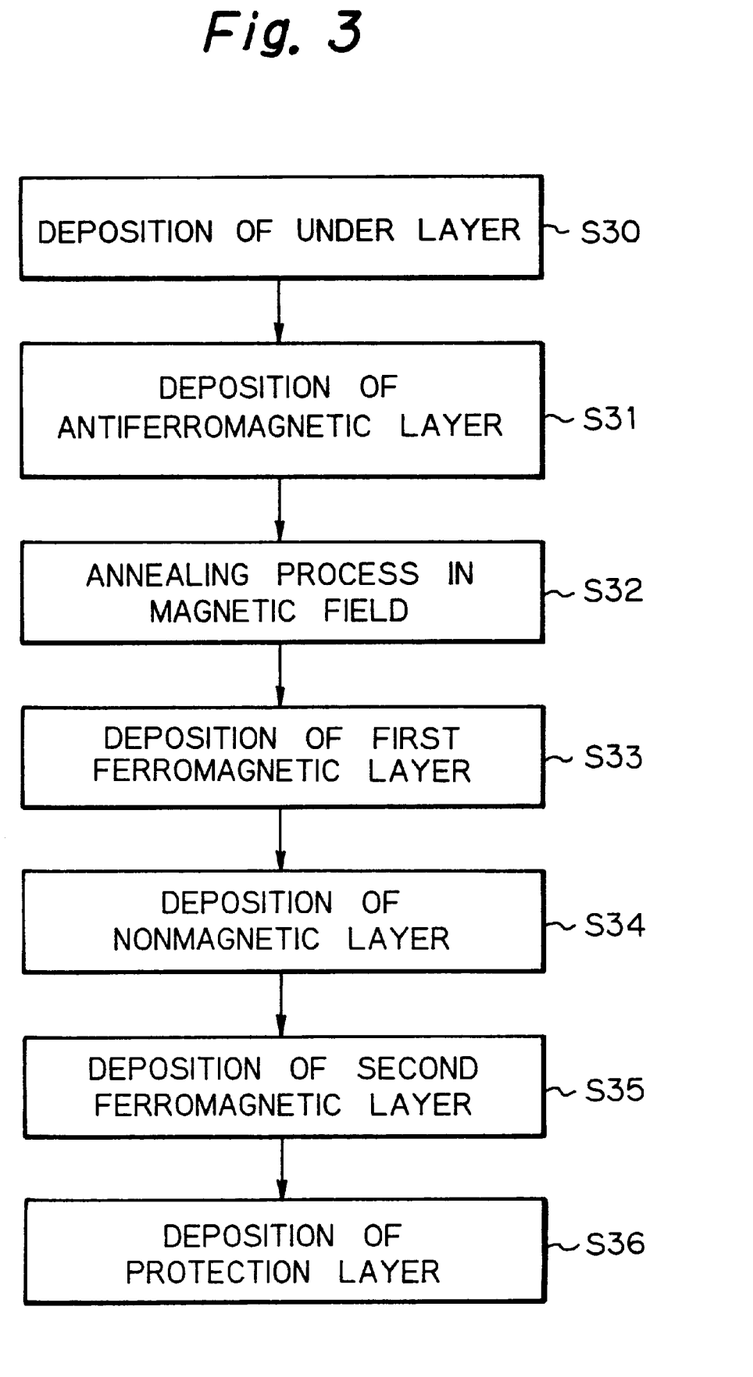
FIG. 3 is a flow chart illustrating an another example of manufacturing processes of the embodiment shown in FIG. 1.

The annealing process in a magnetic field can be carried out before the deposition of the first ferromagnetic material layer 13 on condition that it is done after the deposition of the antiferromagnetic material layer 12 of NiMn. Referring to FIG. 3 which illustrates this manufacturing processes, first, at step S30, the under layer 11 is deposited on the substrate (not shown). Then, at step S31, the antiferromagnetic material layer 12 of NiMn is deposited on the under layer 11. At the next step S32, a long time annealing process in a magnetic field at high temperature with respect to the multilayers is performed to form θ phase of NiMn alloy. Then, at steps S33 to S36, the first ferromagnetic material layer 13, the nonmagnetic material layer 14, the second ferromagnetic material layer 15 and the antioxidant protection layer 16 are sequentially deposited in this order to form a layered spin-valve structure of the MR transducer.

Figure 4:
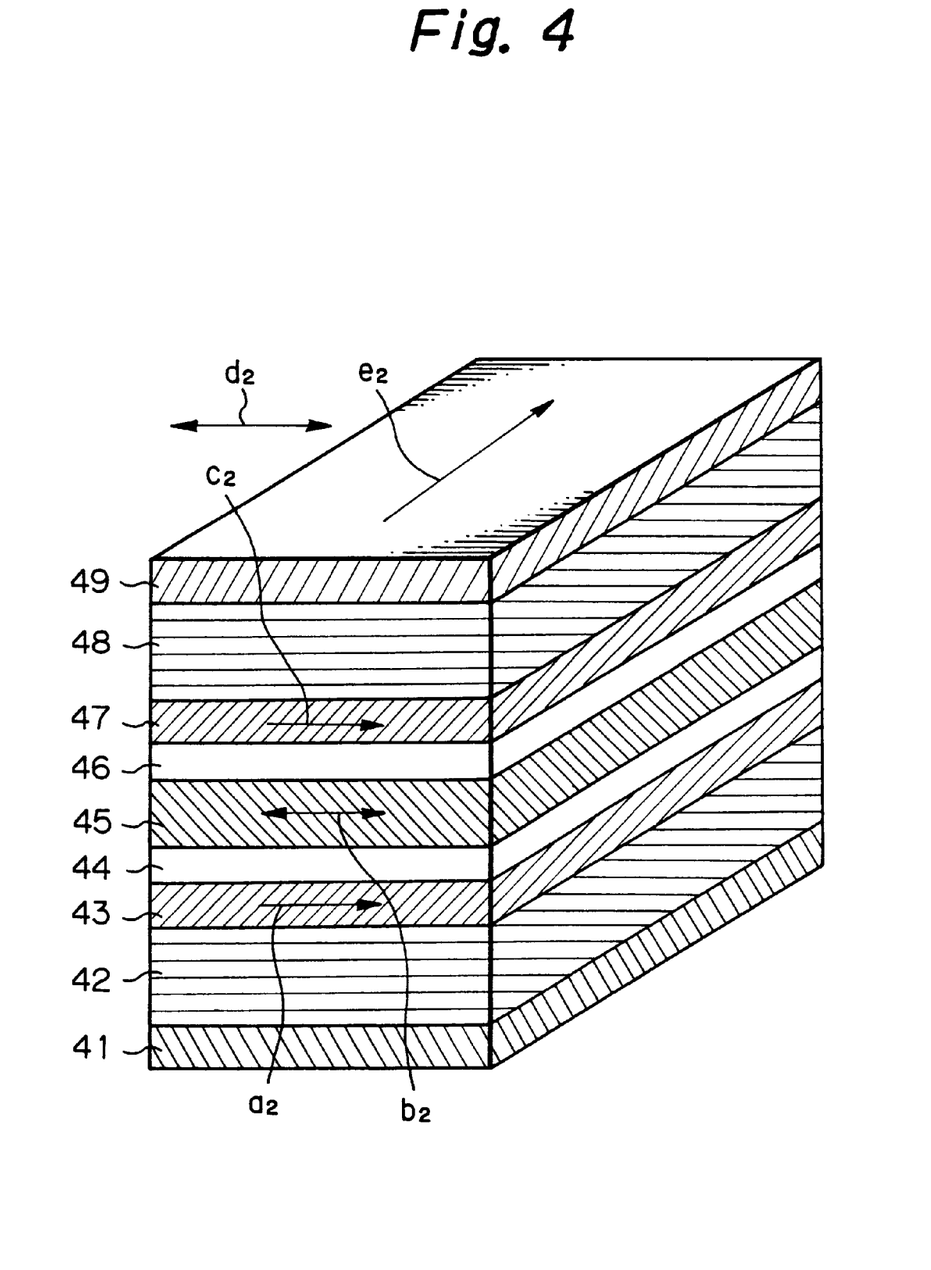
FIG. 4 is an oblique sectional view schematically showing a part of an another embodiment of a MR transducer according to the present invention.

FIG. 4 schematically shows a part of an another embodiment of a MR transducer according to the present invention. In the figure, reference numeral 41 denotes an under layer deposited on a substrate (not shown). On the under layer 41, a first antiferromagnetic material layer 42, a first ferromagnetic material layer 43, a first nonmagnetic material layer 44, a second ferromagnetic material layer 45, a second nonmagnetic material layer 46, a third ferromagnetic material layer 47, a second antiferromagnetic material layer 48 and an antioxidant protection layer 49 are sequentially deposited in this order to form a layered spin-valve structure. Namely, in this embodiment, the MR transducer has a double spin-valve structure.

The magnetization orientation $a_2$ and $c_2$ of the first and third ferromagnetic material layers 43 and 47 are respectively pinned by means of the first and second antiferromagnetic material layers 42 and 48, whereas the magnetization orientation $b_2$ of the second ferromagnetic material layer 45 is freely rotated depending upon magnetic field externally applied thereto, and accordingly, a high sensitive MR effect can be obtained. In the double spin-valve structure, since both interfaces of the second ferromagnetic material layer 45 contribute to MR changes, higher MR effect than that in the fundamental spin-valve structure.

FIG. 4 also illustrates a direction of externally applied magnetic field $d_2$ and a flowing direction of a sense current $e_2$ which are similar to these in the embodiment shown in FIG. 1.

The first, second and third ferromagnetic material layers 43, 45 and 47 may be made of an alloy containing at least one of Ni, Fe and Co. However, it is preferred that the second ferromagnetic material layer 45 is made of a material exhibiting good soft magnetic properties, particularly made of a permalloy with composition of Ni:Fe=81:19 (at %). The first and third ferromagnetic material layers 43 and 47 are preferably made of Co or an alloy containing Co so as to achieve a higher MR ratio. The first and second nonmagnetic material layers 44 and 46 may be made of any one of Cu, Ag and Au, but they are preferably made of Cu.

In this double spin-valve structure, the first antiferromagnetic material layer 42 is made of NiMn, whereas the second antiferromagnetic material layer 48 is made of FeMn. It is preferred that composition of NiMn is Ni:Mn 50:50 (at %).

Hereinafter, influence of a magnetic field produced by sense current flowing through the first and second nonmagnetic material layers 44 and 46 will be described. This field can be ignored if the size of the transducer is large and therefore a current density of the sense current is small. However, for a MR transducer of the magnetic head, large influence of the field will be resulted. The field produced by the current flowing through the first nonmagnetic material layer 44 orients to the opposite direction with respect to the pinned magnetization orientation in the first ferromagnetic material layer 43. On the other hand, the field produced by the current flowing through the second nonmagnetic material layer 46 orients to the same direction with respect to the pinned magnetization orientation in the third ferromagnetic material layer 47. Therefore, the magnetization orientation in the third ferromagnetic material layer 47 is stable, whereas the magnetization orientation in the first ferromagnetic material layer 43 will tend to be disturbed.

According to this embodiment, however, since the first antiferromagnetic material layer 42 is made of NiMn which has a high blocking temperature and a large exchange bias field, the magnetization orientation of the first ferromagnetic material layer 43 can be strongly pinned. In this embodiment, NiMn is used only for the first ferromagnetic material layer 43 because, as aforementioned, this NiMn requires to be annealed at a high temperature in a magnetic field for a long time. Since, disturbance of the magnetization orientation may occur only in the first ferromagnetic material layer 43, it is advantageous to form only the first antiferromagnetic material layer 42 by NiMn which has a high blocking temperature and a large exchange bias field.

In this embodiment, as well as done in the previous embodiment of FIG. 1, after the NiMn layer (the first antiferromagnetic material layer) 42 and the first ferromagnetic material layer 43 are deposited, the long time annealing process in a magnetic field at a high temperature is performed to form the 74 phase having an antiferromagnetic property in the NiMn layer 42. Then, the surface of the first ferromagnetic layer 43 is etched to purify the surface, and thereafter the remaining layers of the double spin-valve structure are sequentially deposited thereon.

Figure 5:
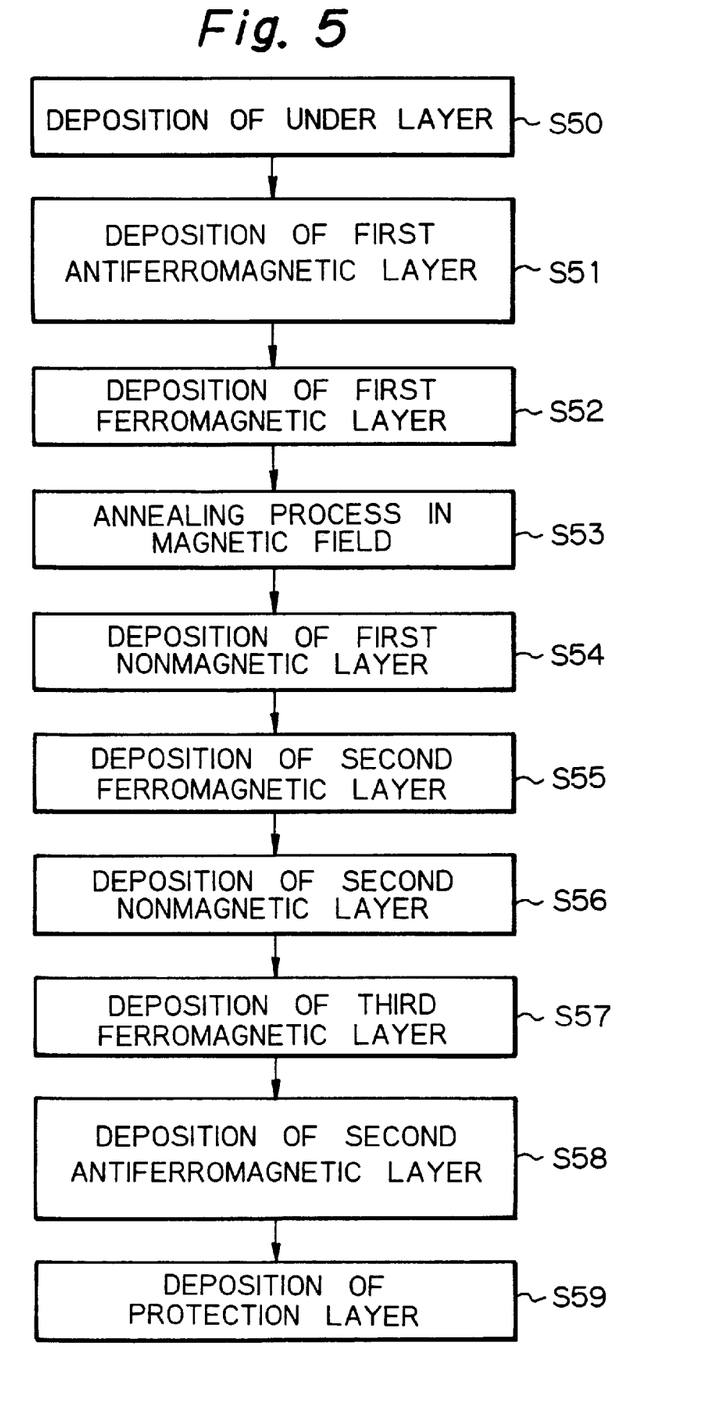
FIG. 5 is a flow chart illustrating an example of manufacturing processes of the embodiment shown in FIG. 4.

Referring to FIG. 5, manufacturing processes of the layered double spin-valve structure shown in FIG. 4 will now be described. First, at step S50, the under layer 41 is deposited on the substrate (not shown). Multilayers of Ta and NiFe will be utilized as the under layer 41. The Ta layer is used for smoothing the interface, whereas the NiFe layer with the fcc structure is used so that the NiMn layer to be formed thereon can easily constitutes a fct structure. The under layer 41 can be made of one of Hf, Cr, Nb, Zr and Ti other than the above-mentioned composition. Then, at steps S51 and S52, the first antiferromagnetic material layer 42 of NiMn and the first ferromagnetic material layer 43 are deposited in sequence. At the next step S53, a long time annealing process in a magnetic field at high temperature with respect to the multilayers is performed to form θ phase of NiMn alloy. Then, at steps S54 to S59, the first nonmagnetic material layer 44, the second ferromagnetic material layer 45, the second nonmagnetic material layer 46, the third ferromagnetic material layer 47, the second antiferromagnetic material layer 48 and the antioxidant protection layer 49 are sequentially deposited in this order to form a layered double spin-valve structure of the MR transducer.

Figure 6:
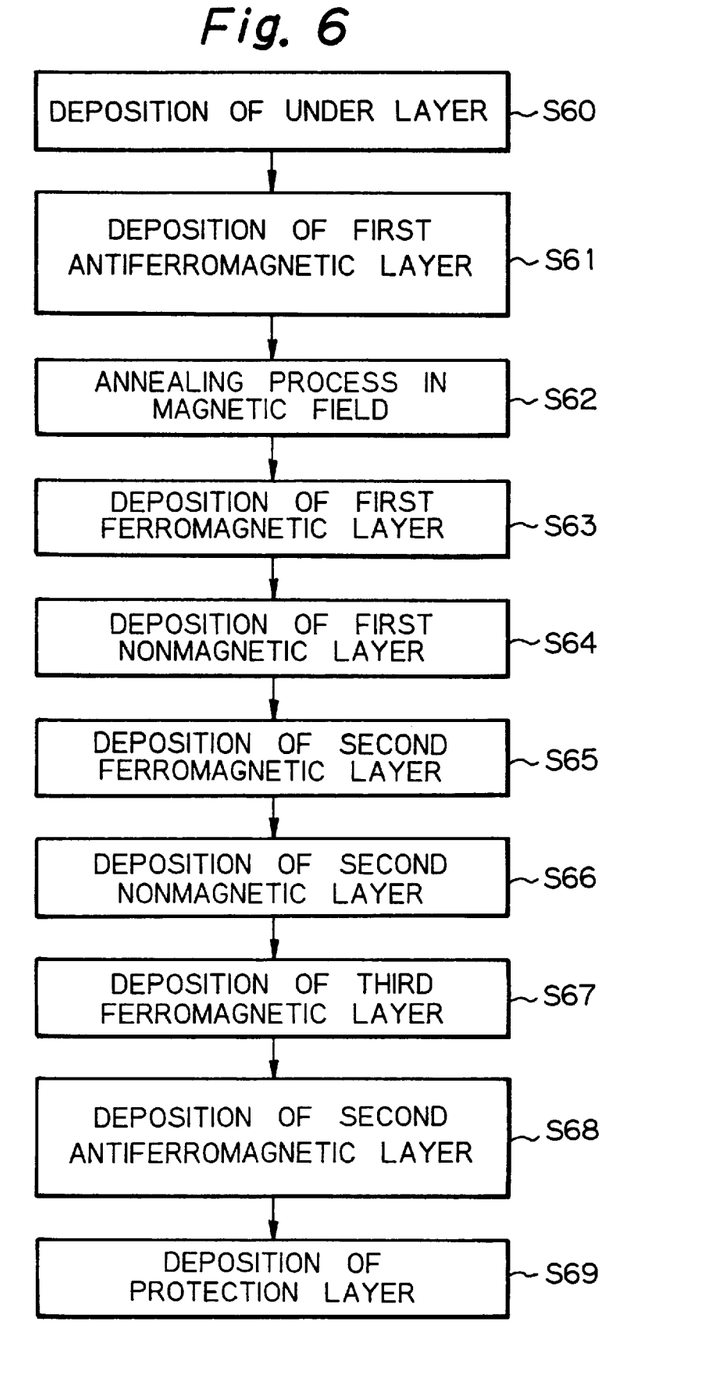
FIG. 6 is a flow chart illustrating an another example of manufacturing processes of the embodiment shown in FIG. 4.

The annealing process in a magnetic field can be carried out before the deposition of the first ferromagnetic material layer 43 on condition that it is done after the deposition of the first antiferromagnetic material layer 42 of NiMn. Referring to FIG. 6 which illustrates this manufacturing processes, first, at step S60, the under layer 41 is deposited on the substrate (not shown). Then, at step S61, the first antiferromagnetic material layer 42 of NiMn is deposited on the under layer 41. At the next step S62, a long time annealing process in a magnetic field at high temperature with respect to the multilayers is performed to form θ phase of NiMn alloy. Then, at steps S63 to S69, the first ferromagnetic material layer 43, the first nonmagnetic material layer 44, the second ferromagnetic material layer 45, the second nonmagnetic material layer 46, the third ferromagnetic material layer 47, the second antiferromagnetic material layer 48 and the antioxidant protection layer 49 are sequentially deposited in this order to form a layered double spin-valve structure of the MR transducer.

EXAMPLE 1

As for a sample for valuation, a fundamental spin-valve structure shown in FIG. 1 is deposited on a glass substrate with a size of 3 inches. The depositions are performed on the glass substrate by RF magnetron sputtering and ion beam sputtering. Conditions of the RF magnetron sputtering are such that an ultimate vacuum is $5 \times 10^{-4}$ Pa or less, a vacuum at the sputtering is about $4 \times 10^{-1}$ Pa, a rate of Ar gas flow is 5 sccm and an RF power is 500 W. Conditions of the ion beam sputtering are such that an ultimate vacuum is $5 \times 10^{-4}$ Pa or less, a vacuum at the sputtering is about $1.2 \times 10^{-2}$ Pa, a rate of Ar gas flow is 7 sccm, an accelerating voltage of a sputter gun is 300 V and an ion current is 30 mA. The films were deposited in a magnetic field of up to about 100 Oe.

Sequence of manufacturing processes of this sample is as follows. As shown in FIG. 2, at first, an under layer 11, a NiMn film of an antiferromagnetic material layer 12 and a Co film of a first ferromagnetic material layer 13 are sequentially deposited in this order on a glass substrate by the RF magnetron sputtering, and then the substrate with the deposited multilayers are taken out from a sputtering chamber. Then, the substrate with the multilayers is set in a heat treat furnace and annealed at a high temperature of 250° C. or more in a magnetic field of 3 kOe for a long time. In this example, a heat treatment wherein temperature is kept at the high temperature for 5 hours and thereafter reduced to room temperature is repeated three times. After the annealing process, the substrate with the multilayers is set in an ion beam sputtering device and the surface of the Co film 13 is etched by ion milling to purify the surface. Thereafter, the remaining layers of the spin-valve structure are sequentially deposited thereon. Composition of the NiMn in this example is Ni:Mn 50:50 (at %).

Figure 7:
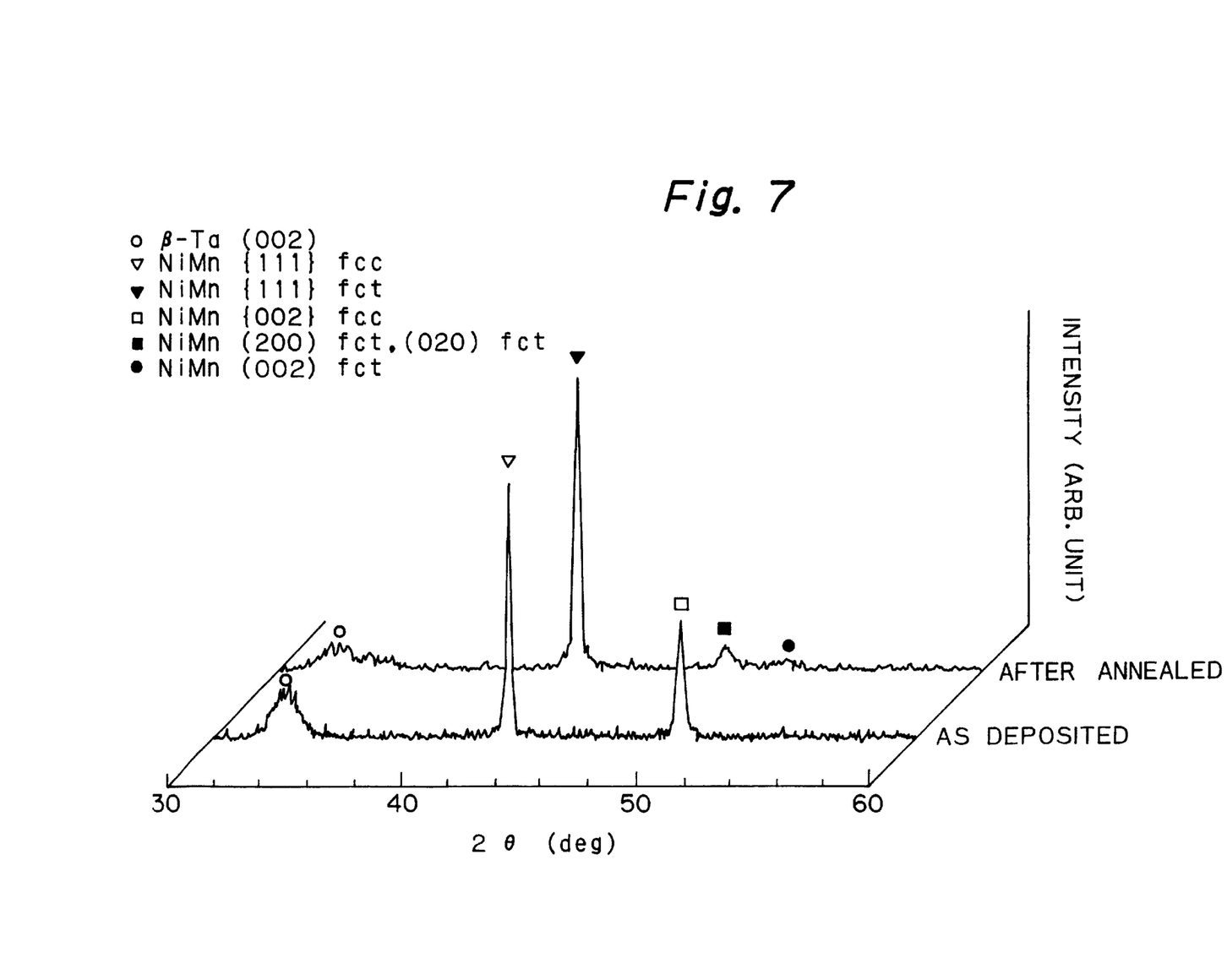
FIG. 7 is a graph illustrating X-ray diffraction patterns of a NiMn film in an example with a spin-valve structure shown in FIG. 1.

FIG. 7 illustrates X-ray diffraction patterns of a NiMn film before and after the annealing process. In order to detect the diffraction patterns, a sample of Ta(50 Angstrom)/NiMn(500 Angstrom)/Ta(50 Angstrom) is used. A peak of the fct structure is detected and thus θ phase exhibiting antiferromagnetic properties is formed after annealing, whereas peaks of the fcc structure are detected before the annealing.

Table 1 indicates materials of each layer, thicknesses X(Angstrom) of each layer, a MR ratio (%), an exchange bias field (Oe) and a condition of annealing process after deposition of a NiMn film with respect to each sample of spin-valve structures manufactured based upon various conditions.

The materials m1, m2, . . . , m7 and their thickness t1, t2, . . . , t7 correspond to the multilayers deposited on the substrate in this order. Namely, materials of the under layer 11 are indicated by m1 and m2 (layer thicknesses t1 and t2), a material of the antiferromagnetic layer 12 is indicated by m3 (layer thickness t3), a material of the first ferromagnetic layer 13 is indicated by m4 (layer thickness t4), a material of the nonmagnetic layer 14 is indicated by m5 (layer thickness t5), a material of the second ferromagnetic layer 15 is indicated by m6 (layer thickness t6) and a material of the protection layer 16 is indicated by m7 (layer thickness t7). The layer thickness in the each sample is selected in optimum.

TABLE 1

| SAMPLE NO. | MATERIALS (m1,m2,m3,m4,m5,m6,m7) | LAYER THICKNESS (Å) (t1,t2,t3,t4,t5,t6,t7) | MR RATIO (%) | EXCHANGE BIAS FIELD (Oe) | CONDITION OF ANNEALING PROCESS |
|---|---|---|---|---|---|
| 1 | (Ta,NiFe,NiMn,Co,Cu,NiFe,Ta) | (50,50,250,45,25,100,50) | 4.0 | 350 | 350° C., 5 hours × 3 times |
| 2 | (Ta,NiFe,NiMn,NiFe,Cu,NiFe,Ta) | (50,50,250,70,25,100,50) | 3.0 | 370 | 350° C., 5 hours × 3 times |
| 3 | (—,NiFe,NiMn,Co,Cu,NiFe,Ta) | (—,70,250,45,25,100,50) | 3.8 | 310 | 350° C., 5 hours × 3 times |
| 4 (reference example) | (Ta,NiFe,FeMn,Co,Cu,NiFe,Ta) | (50,70,120,25,25,100,50) | 2.9 | 210 | 200° C., 1 hour (after depositions of all layers) |
| 5 (reference example) | (Ta,NiFe,NiMn,Co,Cu,NiFe,Ta) | (50,50,250,45,25,100,50) | 0.8 | 350 | 350° C., 5 hours (after depositions of all layers) |

Figure 8:
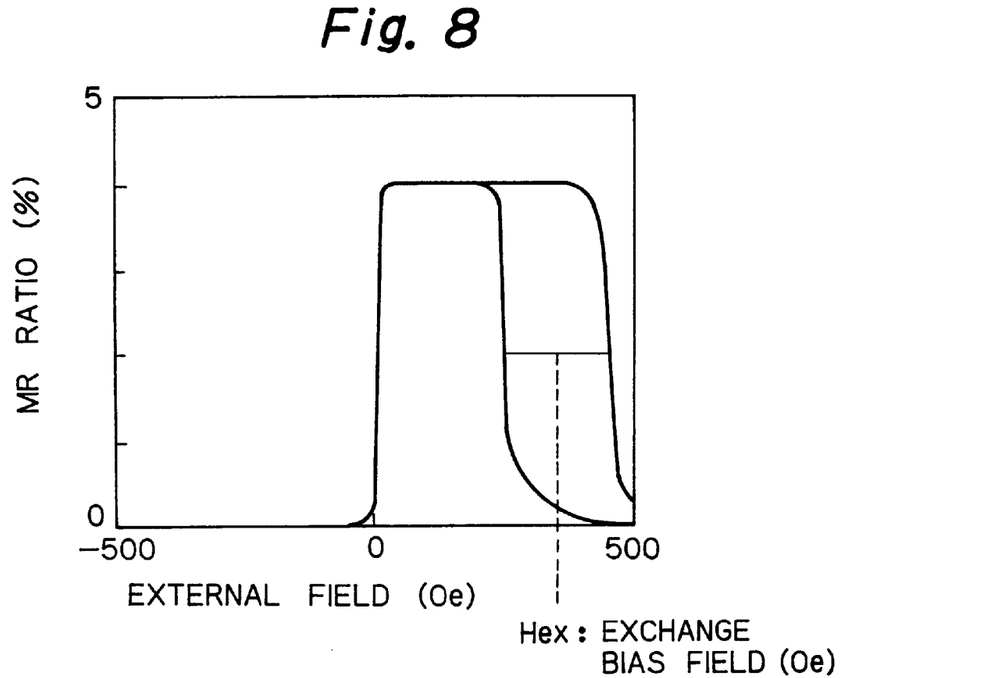
FIG. 8 is a graph illustrating MR response curves in an example with a spin-valve structure shown in FIG. 1.

It will be understood from Table 1 that the samples (sample nos. 1–3) which are formed by depositing the layers 11 to 13, then by annealing the deposited layers at a high temperature in a magnetic field and thereafter by depositing the remaining layers exhibit enough MR ratio and enough exchange bias fields. However, the reference example (sample no. 4) which is formed by depositing all the layers and then by annealing at 200° C. exhibits a poor exchange bias field (210 Oe). Also, the reference example (sample no. 5) which is formed by depositing all the layers and then by annealing at 350° C. cannot obtain a good MR ratio because of mutual diffusions occurring at the interface between the Cu layer (nonmagnetic material layer 14) and the NiFe layer (second ferromagnetic material layer 15). It is not essential conditions to provide the under layer, but the under layer will be advantageous for increasing the exchange bias field. FIG. 8 indicates MR response curves of the no. 1 sample which exhibits the best MR effect.

Tables 2–5 indicate a MR ratio (%) and an exchange bias field (Oe) with respect to each sample which has the same layer structure as that of the no. 1 sample shown in Table 1 but has different layer thicknesses or different annealing conditions.

TABLE 2

| SAMPLE NO. | LYAER THICKNESS (Å) (t1, t2, t3, t4, t5, t6, t7) | MR RATIO (%) | EX- CHANGE BIAS FIELD (O e) |
|---|---|---|---|
| 6 (reference example) | (50, 50, 20, 45, 25, 100, 50) | 0.7 | 15 |
| 7 | (50, 50, 50, 45, 25, 100, 50) | 3.0 | 100 |
| 8 | (50, 50, 100, 45, 25, 100, 50) | 3.8 | 210 |
| 1 | (50, 50, 250, 45, 25, 100, 50) | 4.0 | 350 |
| 9 | (50, 50, 500, 45, 25, 100, 50) | 3.0 | 370 |
| 10 (reference example) | (50, 50, 1000, 45, 25, 100, 50) | 1.8 | 380 |

MATERIALS; (Ta, NiFe, NiMn, Co, Cu, NiFe, Ta)
CONDITION OF ANNEALING PROCESS; 350° C., 5 hours × 3 times

TABLE 3

| SAMPLE NO. | LYAER THICKNESS (Å) (t1, t2, t3, t4, t5, t6, t7) | MR RATIO (%) | EX- CHANGE BIAS FIELD (O e) |
|---|---|---|---|
| 11 (reference example) | (50, 50, 250, 10, 25, 100, 50) | 2.1 | 420 |
| 12 | (50, 50, 250, 15, 25, 100, 50) | 3.0 | 400 |
| 13 | (50, 50, 250, 30, 25, 100, 50) | 3.6 | 380 |
| 1 | (5O, 50, 250, 45, 25, 100, 50) | 4.0 | 350 |
| 14 | (50, 50, 250, 60, 25, 100, 50) | 4.2 | 250 |
| 15 | (50, 50, 250, 150, 25, 100, 50) | 3.9 | 100 |
| 16 (reference example) | (50, 50, 250, 200, 25, 100, 50) | 1.7 | 40 |

MATERIALS; (Ta, NiFe, NiMn, Co, Cu, NiFe, Ta)
CONDITION OF ANNEALING PROCESS; 350° C., 5 hours × 3 times

TABLE 4

| SAMPLE NO. | LYAER THICKNESS (Å) (t1, t2, t3, t4, t5, t6, t7) | MR RATIO (%) | EX- CHANGE BIAS FIELD (O e) |
|---|---|---|---|
| 17 (reference example) | (50, 50, 250, 45, 10, 100, 50) | 2.1 | 280 |
| 18 | (50, 50, 250, 45, 15, 100, 50) | 3.7 | 310 |
| 1 | (50, 50, 250, 45, 25, 100, 50) | 4.0 | 350 |
| 19 | (50, 50, 250, 45, 50, 100, 50) | 3.0 | 350 |
| 20 (reference example) | (50, 50, 250, 45, 80, 100, 50) | 1.5 | 350 |

MATERIALS; (Ta, NiFe, NiMn, Co, Cu, NiFe, Ta)
CONDITION OF ANNEALING PROCESS; 350° C., 5 hours × 3 times

TABLE 5

| SAMPLE NO. | MR RATIO (%) | EXCHANGE BIAS FIELD (O e) | CONDITION OF ANNEALING PROCESS |
|---|---|---|---|
| 21 (reference example) | 0.4 | 20 | 200° C., 10 hours × 2 times |
| 22 | 3.0 | 195 | 250° C., 10 hours × 2 times |
| 1 | 4.0 | 310 | 300° C., 10 hours × 2 times |
| 23 | 4.0 | 400 | 400° C., 10 hours × 2 times |
| 24 | 3.8 | 420 | 450° C., 10 hours × 2 times |

MATERIALS; (Ta, NiFe, NiMn, Co, Cu, NiFe, Ta)

Table 2 shows MR ratios and exchange bias fields of various samples (sample nos. 1 and 6–10) with different thicknesses t3 of the antiferromagnetic material layer 12 (NiMn layer). In order to obtain a larger exchange bias field, the NiMn layer for the antiferromagnetic layer tends to slightly thicker than the FeMn layer. The sample with a too thin NiMn layer (no. 6 sample) cannot obtain enough exchange bias field nor good MR effect. The samples with thicknesses t3 of 50 or more Angstrom (nos. 1 and 7–9 samples) exhibit exchange bias fields of 100 Oe or more as well as MR ratios of 3.0% or more. Preferably large exchange bias field can be obtained by the samples with the thicknesses t3 of about 250 or more Angstrom (nos. 1 and 9). If the thickness t3 increases more than 500 Angstrom, although the exchange bias field gradually increases but the MR ratio decreases because the NiMn layer itself has no effect for increasing the MR ratio. Therefore, preferable thickness of the NiMn layer is about 500 or less Angstrom. In other words, the thickness t3 of the antiferromagnetic material layer 12 is preferably within a range of 50 Angstrom≦t3≦500 Angstrom (nos. 1 and 7–9 samples).

Table 3 shows MR ratios and exchange bias fields of various samples (sample nos. 1 and 11–16) with different thicknesses t4 of the first ferromagnetic material layer 13 (Co layer). The sample with the first ferromagnetic layer 13 with the thickness t4 of 15 Angstrom (no. 12 sample) exhibits a MR ratio of 3.0%. Thus, it is preferred that the thickness t4 is equal to or more than 15 Angstrom. If the thickness t4 increases, a larger MR ratio can be expected, until the thickness of 60 Angstrom (sample nos. 1 and 12–14), due to increased scattering capability of conduction electrons. However, if the thickness t4 increases more than 60 Angstrom, the exchange bias field decreases causing unsatisfied pinning. Furthermore, if the thickness t4 increases more than 150 Angstrom, the MR ratio is extremely reduced. Therefore, the most preferable thickness t4 of the Co layer is about 45 Angstrom (sample no. 1). In other words, the thickness t4 of the first ferromagnetic material layer 13 is preferably within a range of 15 Angstrom≦t4≦150 Angstrom (nos. 1 and 12–15 samples). Since the NiMn layer for the antiferromagnetic layer exhibits a larger exchange bias field than the FeMn layer, the Co layer with the NiMn layer can be formed thicker than that with the FeMn layer causing a higher MR ratio. Table 4 shows MR ratios and exchange bias fields of various samples (sample nos. 1 and 17–20) with different thicknesses t5 of the nonmagnetic material layer 14 (Cu layer). The thickness t5 of the Cu layer 14 affects an intensity of magnetic coupling between the first and second ferromagnetic material layers 13 and 15 because it corresponds to the space between these ferromagnetic layers 13 and 15. If the thickness t5 of the Cu layer is too thin (no. 17 sample), that sample will exhibit a poor MR ratio because magnetization of the second ferromagnetic material layer (NiFe layer) 15 cannot be freely switched with respect to the first ferromagnetic layer (Co layer) 13. Contrary to this, if the thickness t5 of the Cu layer is too thick (no. 20 sample), the MR ratio is extremely reduced due to reduced scattering capability of conduction electrons. Therefore, the thickness t5 of the nonmagnetic material layer 14 is preferably within a range of 15 Angstrom≦t5≦50 Angstrom (nos. 1, 18 and 19 samples), particularly the thickness t5 of about 25 Angstrom (no. 1 sample) is optimum.

Table 5 shows MR ratios and exchange bias fields of various samples (sample nos. 1 and 21–24) with different annealing conditions of the antiferromagnetic material layer 12 (NiMn layer). It will be understood that the higher annealing temperature, the larger exchange bias field. However, since the process temperature cannot be kept too high as for manufacturing a MR transducer, it is preferred that the annealing temperature is within a range up to 400° C. (nos. 1, 22 and 23 samples).

Figure 9:
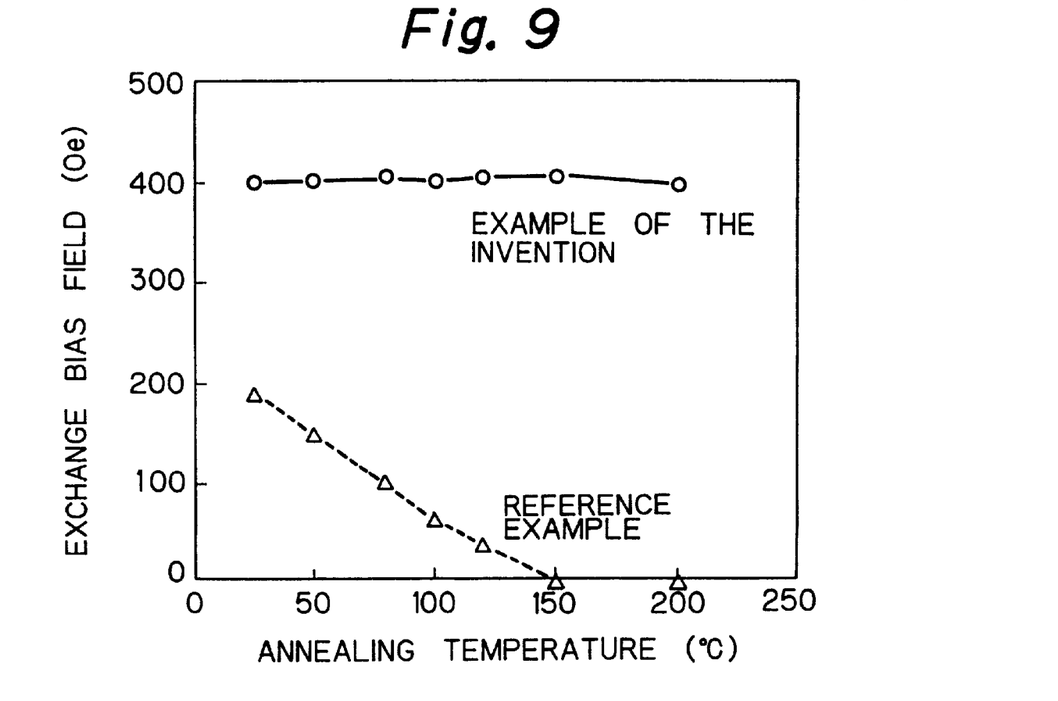
FIG. 9 is a graph illustrating thermal dependency of exchange bias field in an example with a spin-valve structure shown in FIG. 1.

FIG. 9 illustrates thermal dependency of exchange bias field in samples of an example according to the present invention and of a reference example. The spin-valve structure of the sample according to the present invention is Ta(50 Angstrom)/NiMn(250 Angstrom)/Co(45 Angstrom)/Cu(25 Angstrom)/NiFe(100 Angstrom)/Ta(50 Angstrom), and the structure of the sample according to the reference example is Ta(50 Angstrom)/NiFe(70 Angstrom)/FeMn(120 Angstrom)/Co(30 Angstrom)/Cu(25 Angstrom)/NiFe(100 Angstrom)/Ta(50 Angstrom). If FeMn is used for the antiferromagnetic layer material, the exchange bias field will monotonously decrease depending upon the annealing temperature and will reach to near zero Oe at 150° C. as shown by a dotted line in FIG. 9. On the contrary, if NiMn is used for the antiferromagnetic layer material, the exchange bias field is substantially kept at constant even at 200° C. as shown by a solid line in FIG. 9. Namely, according to the present invention, an excellent thermal dependency can be obtained.

In order to test corrosion resistance of these samples, their MR ratios are measured before and after the samples are exposed in an environment with a high temperature and a high humidity. The exposing condition is a temperature of 85° C., a humidity of 85% and a period of one week. The spin-valve structure using FeMn exhibited great deterioration such that the MR ratio reduces from 2.5% to 0.5%, whereas the spin-valve structure using NiMn could keep the MR ratio at constant.

An another sample with a similar pattern as that of a real MR transducer in a MR read head, manufactured by a photolithography, is provided other than the aforementioned sample for valuation in which a fundamental spin-valve structure is deposited on a glass substrate with a size of 3 inches. In this example, the spin-valve structure has a pattern shape of 3×3 $\mu m^2$ as well as a hard magnetic layer and electrode layers formed on its side face.

Figure 10:
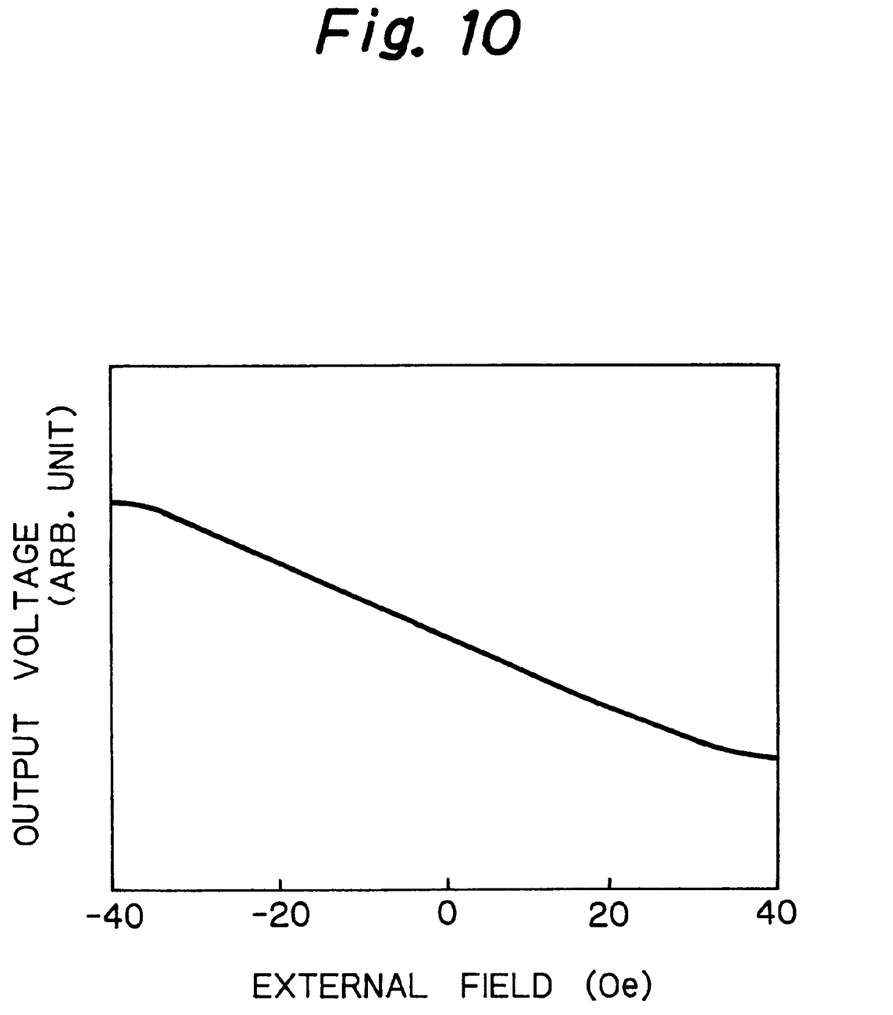
FIG. 10 is a graph illustrating MR response characteristics in an example with a spin-valve structure shown in FIG. 1 and with a shape similar to that of a real MR transducer.

FIG. 10 illustrates MR response characteristics in this spin-valve structure with the similar pattern as that of a real MR transducer. In the figure, the ordinate represents output voltage of the MR transducer, instead of the MR ratio. The spin-valve structure of this sample is Ta(50 Angstrom)/NiMn(250 Angstrom)/Co(45 Angstrom)/Cu(25 Angstrom)/NiFe(100 Angstrom)/Ta(50 Angstrom). The measuring condition is a sense current of 10 mA and an externally applied field of ±40 Oe and 60 Hz. As will be apparent from the figure, a substantially linear MR response can be obtained under application of the external field within a range between ±40 Oe. Furthermore, from this MR response characteristics, no Barkhausen noise can be recognized. This is because possible noise is restrained by using a hard film bias method which is known in the technical field of the magnetic head.

EXAMPLE 2

As for a sample for valuation, a double spin-valve structure shown in FIG. 4 is deposited on a glass substrate with a size of 3 inches. This double spin-valve structure has a first antiferromagnetic material layer 42 of NiMn and a second antiferromagnetic material layer 48 of FeMn. The depositions are performed, as well as done in the example 1, on the glass substrate by RF magnetron sputtering and ion beam In, sputtering. Conditions of the sputterings are the same as those in the example 1. Also, sequence of manufacturing processes of this sample is the same as indicated in FIG. 5.

Table 6 indicates MR ratios (%) of various samples of the double spin-valve structure (sample nos. 25–27) with different thicknesses t4 of the first ferromagnetic material layer 43 (Co layer).

TABLE 6

| SAMPLE NO. | LAYER THICKNESS (Å) (t1, t2, t3, t4, t5, t6, t7, t8, t9, t10) | MR RATIO (%) |
|---|---|---|
| 25 | (50, 50, 250, 20, 25, 100, 25, 30, 120, 50) | 3.6 |
| 26 | (50, 50, 250, 45, 25, 100, 25, 30, 120, 50) | 4.2 |
| 27 | (50, 50, 250, 70, 25, 100, 25, 30, 120, 50) | 3.9 |

MATERIALS; (Ta, NiFe, NiMn, Co, Cu, NiFe, Cu, Co, FeMn, Ta)

In the double spin-valve structure shown in Table 6, materials of the under layer 41 are Ta and NiFe (layer thicknesses t1 and t2), a material of the first antiferromagnetic layer 42 is NiMn (layer thickness t3), a material of the first ferromagnetic layer 43 is Co (layer thickness t4), a material of the first nonmagnetic layer 44 is Cu (layer thickness t5), a material of the second ferromagnetic layer 45 is NiFe (layer thickness t6), a material of the second nonmagnetic layer 46 is Cu (layer thickness t7), a material of the third ferromagnetic layer 47 is Co (layer thickness t8), a material of the second antiferromagnetic layer 48 is FeMn (layer thickness t9), and a material of the protection layer 49 is Ta (layer thickness t10).

Similar to the example 1, since the NiMn layer for the first antiferromagnetic layer 42 exhibits a larger exchange bias field than the FeMn layer, the Co layer for the first ferromagnetic layer 43 adjacent to the NiMn layer can be formed thicker than that with the FeMn layer causing a higher MR ratio (no. 25–27 samples).

An another sample with a similar pattern as that of a real MR transducer in a MR read head, manufactured by a photolithography, is provided other than the aforementioned sample for valuation in which a double spin-valve structure is deposited on a glass substrate with a size of 3 inches. In this example, the double spin-valve structure has a pattern shape of 3×3 $\mu m^2$ as well as a hard magnetic layer and electrode layers formed on its side face.

MR response characteristics in this double spin-valve structure with the similar pattern as that of a real MR Gotransducer is measured. Since NiMn which exhibits a large exchange bias field is used for the first antiferromagnetic layer material, magnetization orientation in the first ferromagnetic layer (Co layer) 43 will not be so disturbed even if field produced by current flowing through the first nonmagnetic layer (Cu layer) 44 is applied thereto resulting only a few reduction of the MR ratio. Furthermore, output voltages per unit resistance of two transducer samples respectively using NiMn and FeMn which materials exhibit the same MR ratio in case that the double spin-valve structures are formed on substrates with a size of 3 inches are measured. As a result, the measured output voltage of the transducer sample using NiMn is 1.2 times as that of the another transducer sample using FeMn. As will be understood, using of NiMn as for the first antiferromagnetic layer material is very preferable to stabilize the magnetization orientations in the first ferromagnetic layer 43.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of manufacturing a magnetoresistive transducer with a spin-valve structure, said method including a deposition process for depositing thin-film layers on a substrate and an annealing process of annealing said deposited layers in a magnetic field;

said deposition process comprising the steps of sequentially depositing at least an antiferromagnetic material layer, a first ferromagnetic material layer, a nonmagnetic material layer and a second ferromagnetic material layer on said substrate in this order, to form said spin-valve structure; and said annealing process being performed before said depositing steps of the nonmagnetic material layer and the second ferromagnetic material layer.

2. The method as claimed in claim 1, wherein said deposition process comprises steps of sequentially depositing at least an antiferromagnetic material layer made of a NiMn alloy, a first ferromagnetic material layer, a nonmagnetic material layer and a second ferromagnetic material layer on said substrate in this order.

3. The method as claimed in claim 2, wherein said annealing process is a process for forming θ phase of said NiMn, and is performed after said depositing step of the first ferromagnetic material layer.

4. The method as claimed in claim 2, wherein said annealing process is a process for forming θ phase of said NiMn, and is performed before said depositing step of the first ferromagnetic material layer.

5. A method of manufacturing a magnetoresistive transducer with a spin-valve structure, said method including a deposition process for depositing thin-film layers on a substrate and an annealing process of annealing said deposited layers in a magnetic field;

said deposition process comprising the steps of sequentially depositing at least a first antiferromagnetic material layer, a first ferromagnetic layer, a first nonmagnetic material layer, a second ferromagnetic material layer, a second nonmagnetic material layer, a third ferromagnetic material layer and a second antiferromagnetic material layer on said substrate in this order, to form said spin-valve structure; and said annealing process being performed before said depositing steps of the first nonmagnetic material layer and the second ferromagnetic material layer.

6. The method as claimed in claim 5, wherein said deposition comprises steps of sequentially depositing at least a first antiferromagnetic material layer made of a NiMn alloy, a first ferromagnetic material layer, a first nonmagnetic material layer, a second ferromagnetic material layer, a second nonmagnetic material layer, a third ferromagnetic material layer and a second antiferromagnetic material layer.

7. The method as claimed in claim 6, wherein said annealing process is a process for forming θ phase of said NiMn, and is performed before said depositing step of the first ferromagnetic material layer.

8. The method as claimed in claim 6, wherein said annealing process is a process for forming θ phase of said NiMn, and is performed before said depositing step of the first ferromagnetic material layer.

* * * * *